(12) United States Patent
Weilemann, II et al.

(10) Patent No.: US 9,329,933 B2
(45) Date of Patent: May 3, 2016

(54) IMMINENT READ FAILURE DETECTION BASED UPON CHANGES IN ERROR VOLTAGE WINDOWS FOR NVM CELLS

(71) Applicants: Jon W. Weilemann, II, Austin, TX (US); Richard K. Eguchi, Austin, TX (US)

(72) Inventors: Jon W. Weilemann, II, Austin, TX (US); Richard K. Eguchi, Austin, TX (US)

(73) Assignee: Freescale Semiconductor, Inc., Austin, TX (US)

( * ) Notice: Subject to any disclaimer, the term of this patent is extended or adjusted under 35 U.S.C. 154(b) by 91 days.

(21) Appl. No.: 14/262,157

(22) Filed: Apr. 25, 2014

(65) Prior Publication Data
US 2015/0309858 A1    Oct. 29, 2015

(51) Int. Cl.
| | |
|---|---|
| G11C 29/00 | (2006.01) |
| G06F 11/10 | (2006.01) |
| G06F 11/07 | (2006.01) |
| G06F 11/00 | (2006.01) |
| G11C 16/34 | (2006.01) |
| G11C 29/42 | (2006.01) |
| G11C 11/56 | (2006.01) |

(52) U.S. Cl.
CPC .......... *G06F 11/1008* (2013.01); *G06F 11/008* (2013.01); *G06F 11/073* (2013.01); *G06F 11/0757* (2013.01); *G06F 11/1068* (2013.01); *G11C 16/349* (2013.01); *G11C 29/42* (2013.01); *G11C 11/5642* (2013.01)

(58) Field of Classification Search
CPC   G06F 11/0772; G06F 11/078; G06F 11/1008
See application file for complete search history.

(56) References Cited

U.S. PATENT DOCUMENTS

| | | | |
|---|---|---|---|
| 6,226,200 B1 | 5/2001 | Eguchi et al. | |
| 6,684,353 B1 | 1/2004 | Parker et al. | |
| 7,865,797 B2 | 1/2011 | Eguchi et al. | |
| 7,944,744 B2 | 5/2011 | Bryant-Rich | |
| 8,095,836 B2 | 1/2012 | Eguchi et al. | |
| 8,321,727 B2 | 11/2012 | D'Abreu et al. | |
| 8,504,884 B2 | 8/2013 | Eguchi et al. | |
| 2009/0204852 A1* | 8/2009 | Diggs ................. | G06F 11/008 714/42 |
| 2011/0107160 A1 | 5/2011 | Eguchi et al. | |

(Continued)

OTHER PUBLICATIONS

Weilemann et al., "Imminent Read Failure Detection Based Upon Unacceptable Wear for NVM Cells", FRSC:034; U.S. Appl. No. 14/262,116, filed Apr. 25, 2014; 23 pgs.

(Continued)

*Primary Examiner* — Sam Rizk
(74) *Attorney, Agent, or Firm* — Egan, Peterman, Enders & Huston LLP

(57) ABSTRACT

Methods and systems are disclosed for imminent read failure detection based upon changes in error voltage windows for non-volatile memory (NVM) cells. In certain embodiments, data stored within an array of NVM cells is checked at a first time using a diagnostic mode and high/low read voltage sweeps to determine a first error voltage window where high/low uncorrectable errors are detected. Stored data is then checked at a second time using the diagnostic mode and high/low read voltage sweeps to determine a second error voltage window where high/low uncorrectable errors are detected. The difference between the error voltage windows are then compared against a voltage difference threshold value to determine whether or not to indicate an imminent read failure condition. An address sequencer, error correction code (ECC) logic, and a bias generator can be used to implement the imminent failure detection.

20 Claims, 4 Drawing Sheets

(56) References Cited

U.S. PATENT DOCUMENTS

2012/0254699 A1  10/2012  Ruby et al.
2014/0059398 A1* 2/2014  Cunningham ...... G06F 11/1048
                                                714/721

OTHER PUBLICATIONS

Weilemann et al., "Imminent Read Failure Detection Using High/Low Read Voltage Levels", FRSC:033, U.S. Appl. No. 14/262,074, filed Apr. 25, 2014; 28 pgs.

Office Action mailed Sep. 18, 2015, for Weilemann et al., "Imminent Read Failure Detection Using High/Low Read Voltage Levels", U.S. Appl. No. 14/262,074, filed Apr. 25, 2014; 14 pgs.

Office Action mailed Sep. 21, 2015, for Weilemann et al., "Imminent Read Failure Detection Based Upon Unacceptable Wear for NVM Cells", U.S. Appl. No. 14/262,116, filed Apr. 25, 2014; 11 pgs.

Response to Office Action filed Dec. 21, 2015, for Weilemann et al., "Imminent Read Failure Detection Using High/Low Read Voltage Levels", U.S. Appl. No. 14/262,074, filed Apr. 25, 2014; 8 pgs.

Response to Office Action filed Dec. 21, 2015, for Weilemann et al., "Imminent Read Failure Detection Based Upon Unacceptable Wear for NVM Cells", U.S. Appl. No. 14/262,116, filed Apr. 25, 2014; 6 pgs.

* cited by examiner

IMMINENT READ FAILURE DETECTION BASED UPON CHANGES IN ERROR VOLTAGE WINDOWS FOR NVM CELLS

RELATED APPLICATIONS

This application is related in subject matter to the following concurrently filed applications: U.S. patent application Ser. No. 14/262,074, entitled "IMMINENT READ FAILURE DETECTION USING HIGH/LOW READ VOLTAGE LEVELS," and U.S. patent application Ser. No. 14/262,116, entitled "IMMINENT READ FAILURE DETECTION BASED UPON UNACCEPTABLE WEAR FOR NVM CELLS," and which are each hereby incorporated by reference in its entirety.

TECHNICAL FIELD

This technical field relates to non-volatile memories (NVMs) and, more particularly, to techniques for detecting imminent read failures for data stored by NVM cells.

BACKGROUND

Programmable memories have been implemented using non-volatile memory (NVM) cells with each cell storing a bit of data. These programmable memories can be implemented as stand-alone memory integrated circuits or can be embedded within other integrated circuits.

During operation, data stored within NVM cells can include errors. As such, many NVM systems use error correction code (ECC) routines to improve performance. For example, for multi-bit data located at a given address within the NVM system, an ECC routine is applied to the multi-bit data to generate ECC data that is stored within the NVM system and associated with the multi-bit data. When this multi-bit data is subsequently read from the address location, the ECC routine is performed again to re-generate the ECC data for the multi-bit data. The re-generated ECC data is then compared to the original ECC data to determine if there are bit errors associated with the data stored at that address. For example, ECC routines can be employed that can identify and correct single-bit errors and that can identify but not correct double-bit errors. Further, for such ECC routines, errors including three or more bits can be inaccurately detected as single-bit or double-bit errors or no errors.

For some applications where read failures can cause catastrophic results, it is desirable to detect uncorrectable read failures that have not yet occurred but are likely to occur in the near future. Identifying imminent read failures for NVM cells allow these read failures to be avoided thereby avoiding potential catastrophic results for sensitive applications.

DESCRIPTION OF THE DRAWINGS

It is noted that the appended figures illustrate only example embodiments and are, therefore, not to be considered as limiting the scope of the present invention. Elements in the figures are illustrated for simplicity and clarity and have not necessarily been drawn to scale

DETAILED DESCRIPTION

Methods and systems are disclosed for imminent read failure detection based upon changes in error voltage windows for non-volatile memory (NVM) cells. In certain embodiments, data stored within an array of NVM cells is checked at a first time using a diagnostic mode and high/low read voltage sweeps to determine a first error voltage window where high/low uncorrectable errors are detected. Data stored within an array of NVM cells is then checked at a second time using the diagnostic mode and high/low read voltage sweeps to determine a second error voltage window where high/low uncorrectable errors are detected. The difference between the first and second error voltage windows are then compared against a voltage difference threshold value to determine if the rate of wear for the array of NVM cells is unacceptable. If so, an imminent read failure is indicated. For the array data checks, an address sequencer can be used to cycle through addresses within the array of NVM cells; error correction code (ECC) logic can be used to detect read errors; and a bias generator can be used to adjust the read voltage levels for the array of NVM cells. Different features and variations can also be implemented and related or modified systems and method can be utilized, as well.

As described further herein, wear within the NVM cell array will cause the read voltage levels for the NVM cells to shift towards the normal read voltage level. The disclosed embodiments use error voltage windows detected at different times to determine if a wear rate for the NVM cells is occurring at an unacceptable rate. For example, a diagnostic mode can be used at different times along with high/low read voltage sweeps to determine a high/low read error voltage window associated with each different time. For certain embodiments, the high/low error voltage levels are determined by the detection of uncorrectable bit errors within the read voltage sweeps, such as bit errors that are uncorrectable by one or more error correction code (ECC) routines used within the NVM system. The difference between the error voltage windows are then compared to a voltage difference threshold value, and an imminent failure condition is indicated based upon the comparison. As described below, an indicator signal can be output by the NVM system and/or a flag can be set within the NVM system to indicate the imminent failure condition. Further, the voltage difference threshold value can be stored within the NVM system such as within a predefined calibration table. For certain embodiments, if the detected difference is greater than the threshold value, the NVM cell array is deemed to be wearing too fast, and this unacceptable wear is deemed to represent an imminent read failure condition where false read pass determinations may occur. Variations can also be implemented.

Figure 1:
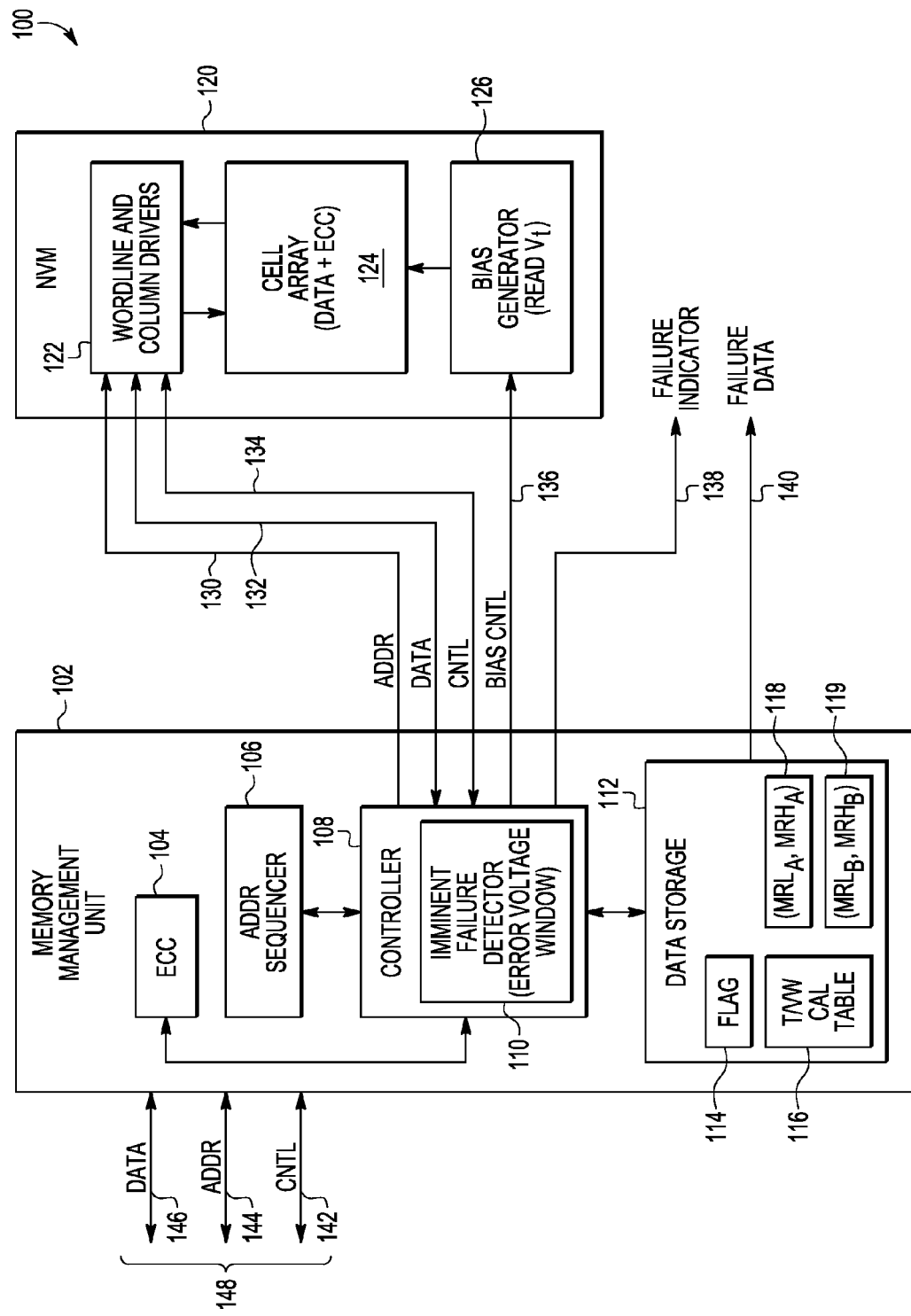
FIG. 1 is a block diagram for an NVM system that includes a memory management unit that detects error voltage windows for non-volatile memory (NVM) cells within the NVM system.

FIG. 1 is a block diagram for an NVM system 100 that includes a memory management unit (MMU) 102 and a non-volatile memory (NVM) 120. The NVM 120 includes an array of NVM cells 124, wordline and column drivers 122, and bias generator 126. The memory management unit 102 includes error correction code (ECC) logic 104, address sequencer 106, controller 108, and data storage medium 112. The memory management unit 102 and the NVM 120 in part communicate address information through address (ADDR)

signal lines 130, data through data (DATA) signal lines 132, and control information through control (CNTL) signal lines 134. The controller 108 further includes an imminent failure detector 110 that runs a diagnostic mode at different times to determine imminent failures based upon wear rates associated with high/low error voltage windows, as described in more detail below. Read margin levels (e.g., read threshold voltage (Vt) levels) are adjusted for the cell array 124 through bias control (CNTL) signals 136 provided to the bias generator 126. For a read operation, an NVM cell will be deemed to be programmed (e.g., representing a first logic level) if it has a voltage level above the read voltage level, and an NVM cell will be deemed to be erased (e.g., representing a complement logic level) if it has a voltage level below the read voltage level.

Results and other data for the imminent failure determination can be stored as data within data storage medium 112. Failure related data can include, for example, a pass/fail flag 114, a calibration table 116 including time (T) values associated with expected voltage window (VW) values, a first set of low/high error voltage levels ($MRL_A$, $MRH_A$) 118 determined from a first diagnostic test at a first time, a second set of low/high error voltage levels ($MRL_B$, $MRH_B$) 119 determined from a second diagnostic test at a second time, and/or other data. As described further below, the time (T) values and the expected voltage window (VW) values can be stored in a calibration table within data storage medium 112. The calibration table can then be used to lookup expected voltage window values for the two different times ($T_A$, $T_B$) when the diagnostic mode is run, and the difference between these expected voltage time window values ($VW_A-VW_B$) can be used to determine a voltage difference threshold value ($V_{TH}$). A failure indicator 138 can be output by the memory management unit 102, and failure data 140 can be accessed by external circuitry or devices coupled to the memory management unit 102 and/or output by the NVM system 100 for use by external circuitry or devices. It is noted that the memory management unit 102 can be configured to communicate with external devices or circuitry through signal lines 148. For example, control information can be communicated through control (CNTL) signal lines 142; address information can be communicated through address (ADDR) signal lines 144; and data information can be communicated through data (DATA) signal lines 146. Additional and/or different interfaces can also be provided for the NVM system 100.

It is further noted that the memory control circuitry 102 and the NVM 120 can be integrated within a single integrated circuit or can be within separate integrated circuits, as desired. External devices or circuitry that communicate through signal lines 148 with the NVM system 100 can be additional circuitry that is located within the same integrated circuit(s) as the NVM system 100 or can be external to the integrated circuit(s) that include the NVM system 100. It is also noted that the NVM system 100 can include components and/or functional blocks in addition to the memory management unit 102 and the NVM 120, and the memory management unit 102 and/or the NVM 120 can also include additional functional blocks in addition to those depicted.

The NVM cell array 124 includes a plurality of NVM cells. In operation, the NVM cells are placed in programmed or erased states that represent logic values stored by the NVM cells. Error correction code (ECC) data associated with ECC routines implemented by the ECC logic 104 can be stored along with the data within the NVM cell array 124 or can be stored in another data storage medium such as data storage medium 112. For writes, the ECC logic 104 receives data to be stored in the NVM cell array 124 and generates the ECC data using one or more ECC routines. When the data is subsequently read from the NVM array 124 during a normal read operation or during a diagnostic read operation, the ECC data is also read. The ECC logic 104 then re-generates ECC check data based upon the data read from the NVM cell array 124. The ECC check data is then compared against the stored ECC data. If this comparison matches, then the data is deemed correct. If the comparison does not match, the data is deemed to include errors. In certain embodiments, the ECC routine(s) within the ECC logic 104 are configured to detect and correct single-bit errors and to detect but not correct double-bit errors. Other ECC routines could also be used that detect uncorrectable bit errors.

The wordline driver and column drivers 122 provide access to the cell array 124. Wordline drivers apply wordline voltages to select rows of NVM cells within the NVM cell array 124. The rows of NVM cells are selected based upon the row address (ADDR) information 130 provided by the memory management unit 102. The column drivers access bit lines associated with the selected rows of NVM cells. Data to be written to and read from the cell array 124 is provided from the wordline and column drivers 122 to the memory management unit through data signals 132. The bias generator 126 generates bias signals that are applied to the cell array 124 during memory operations such as program, soft program, program verify, soft program verify, erase, erase verify, and/or read operations. The read voltage (Vt) level, which is adjusted in the embodiment described herein, is determined by the bias signals provided by the bias generator 126 to the NVM cell array 124. The data storage medium 112 can be any volatile or non-volatile programmable data storage medium that is configured to store data, such as a data register, a DRAM (dynamic random access memory), an additional NVM, and/or other data storage medium. The data storage medium 112 could also be located internal to or external from the memory management unit 102. For example, a portion of the NVM 120 could be used to provide the data storage medium 112. Other variations could also be implemented.

Read operations are used for memory diagnostics in addition to normal non-diagnostic read operations. For memory diagnostics, the controller 108 uses the address sequencer 106 to access each of the addresses within the cell array 124, reads data associated from each these addresses, and applies ECC routine(s) to the read data to determine if data errors exist within the cell array. As described in more detail herein, the imminent error detector 110 uses the diagnostic mode to detect imminent read failures based upon changes over time in error voltage windows for the NVM cells 124. The failure indicator 138 indicates whether an imminent failure is detected, and the failure data 140 includes data associated with the imminent failure and/or other desired information related to the imminent failure.

As described above, the ECC logic 104 applies one or more ECC routines to data being written to the NVM cell array 104 and generates ECC data that is stored and associated with data written to the NVM cell array 104. During a read operation, the ECC data is compared to re-generated ECC data to determine if data read from the NVM cell array includes bit errors. As further described below, the results of the ECC routine(s) applied by the ECC logic 104 are used by the imminent failure detector 110. It is further noted that the embodiments disclosed herein can use any desired ECC routine where single-bit or multiple-bit errors are detected and where certain detected errors are not correctable by the ECC routine(s). For example, ECC routine(s) can be used that are able to detect and correct single-bit errors and are able to detect but not correct double-bit errors. It is further noted that the one or more ECC routines used for ECC logic 104 can be based upon Hamming codes, Reed-Solomon codes, BCH (Bose-Chaudhuri-Hocquenghem) codes, Viterbi decoders, and/or other error correction code techniques, as desired.

It is noted that the NVM systems described herein can be a variety of different NVM systems, including FLASH memory systems, systems using floating-gate NVM cells, systems using split-gate NVM cells, and/or other desired NVM systems. Further, charge storage layers within NVM cells can include discrete charge storage layers (e.g., silicon nanocrystals, metal nanoclusters, nitride, etc.), continuous charge storage layers (e.g., polysilicon, etc.), or other charge storage layers, if desired.

Figure 2:
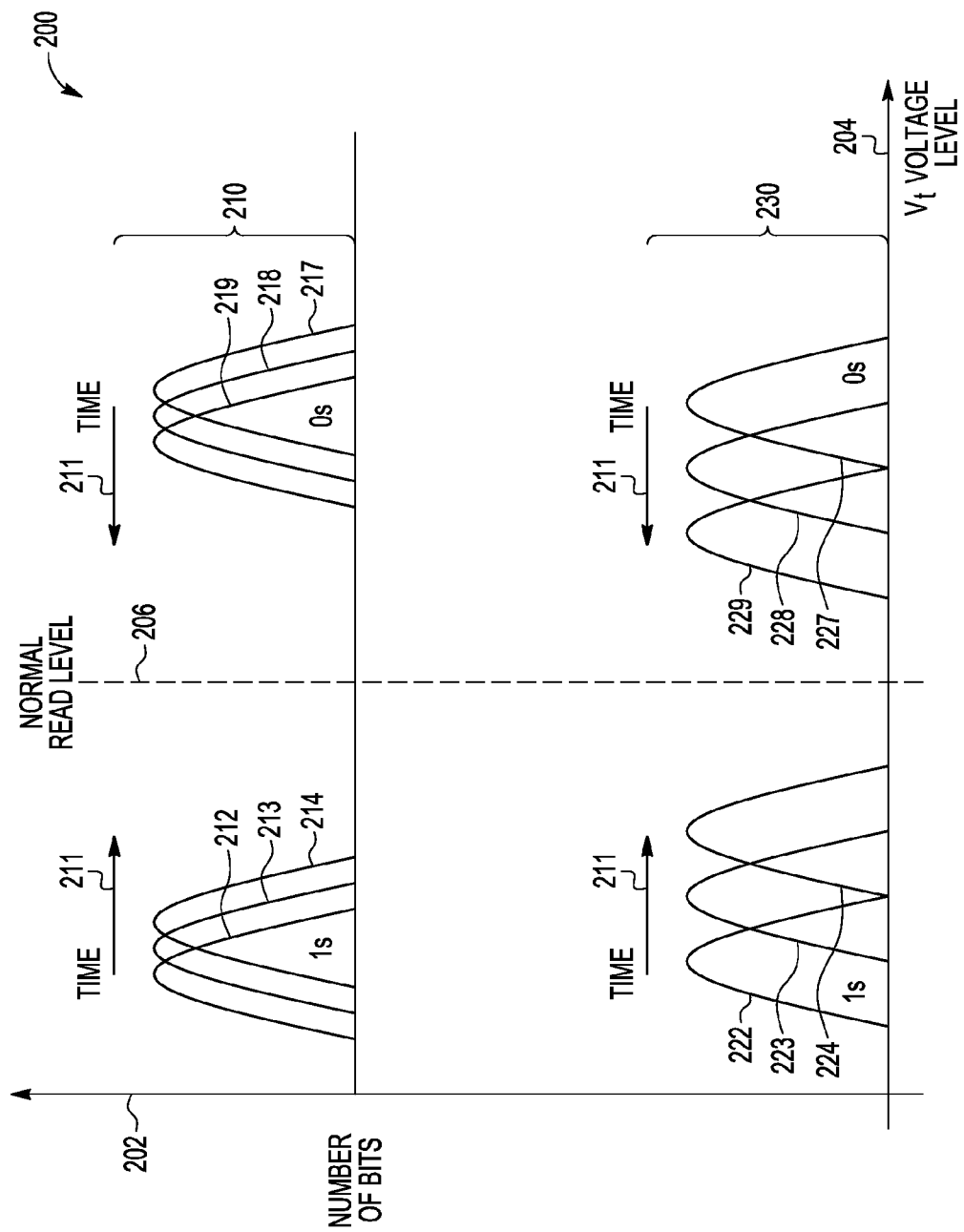
FIG. 2 is a bit distribution histogram showing representative changes that can occur in voltages stored in NVM cells over time.

FIG. 2 is a bit distribution histogram 200 showing representative changes that can occur in voltages stored in NVM cells over time. The y-axis 202 represents a number of bits within the array having threshold voltage (Vt) levels in an erased state (e.g., representing logic 1s) and in a programmed state (e.g., representing logic 0s). The x-axis 204 represents threshold voltage (Vt) levels for the NVM cells. The distribution curves 212, 213, 214, 222, 223, and 224 represent the erased state bits, and the distribution curves 217, 218, 219, 227, 228, and 229 represent the programmed state bits. Voltage level 206 represents a normal read level such that bits having voltage levels above this read level are deemed to be programmed bits (e.g., logic 0s) and bits having voltage levels below this read level are deemed to be erased bits (e.g., logic 1s). It is noted that the logic 0 or logic 1 designation give to an erased or programmed bit could be switched, if desired, such that an erased bit is a logic 0 and a programmed bit is a logic 1. It is also noted that the erased bits represent NVM cells that are in an erased state and that programmed bits represent NVM cells in a programmed state. As one example, the normal read voltage level 206 can be 4.5 volts.

Distributions 210 provides changes that can occur in the voltage distributions over time due to wear for the NVM cells where the wear is occurring at an acceptable rate. For example, the initial voltage distribution 212 for erased cells moves higher over time as represented by arrow 211 and distributions 213 and 214. Similarly, the initial voltage distribution 217 for programmed cells moves lower over time as represented by arrow 211 and distributions 218 and 219. As further described herein, the wear rate for the NVM cells is deemed acceptable if error voltage windows between high and low distributions shift by less than a voltage difference threshold value ($V_{TH}$) over a selected time period represented by arrow 211.

Distributions 230 provides changes that can occur in the voltage distributions over time due to wear for the NVM cells where the wear is occurring at an unacceptable rate. For example, the initial voltage distribution 222 moves higher over time as represented by arrow 211 and distributions 223 and 224. Similarly, the initial voltage distribution 227 for programmed cells moves lower over time as represented by arrow 211 and distributions 228 and 229. As further described herein, the wear rate for the NVM cells is deemed unacceptable if error voltage windows between high and low distributions shift by more than a voltage difference threshold value ($V_{TH}$) over a selected time period represented by arrow 211. The relatively rapid wear rate represented by distributions 230 can indicate that the NVM cells are operating outside of acceptable parameters in that they are showing signs of unusually quick wear as represented by the rapid movement of the distributions over time. This unexpected and unacceptable wear represents the potential for read failures or false pass ECC checks that may lead to catastrophic results in sensitive applications.

Figure 3:
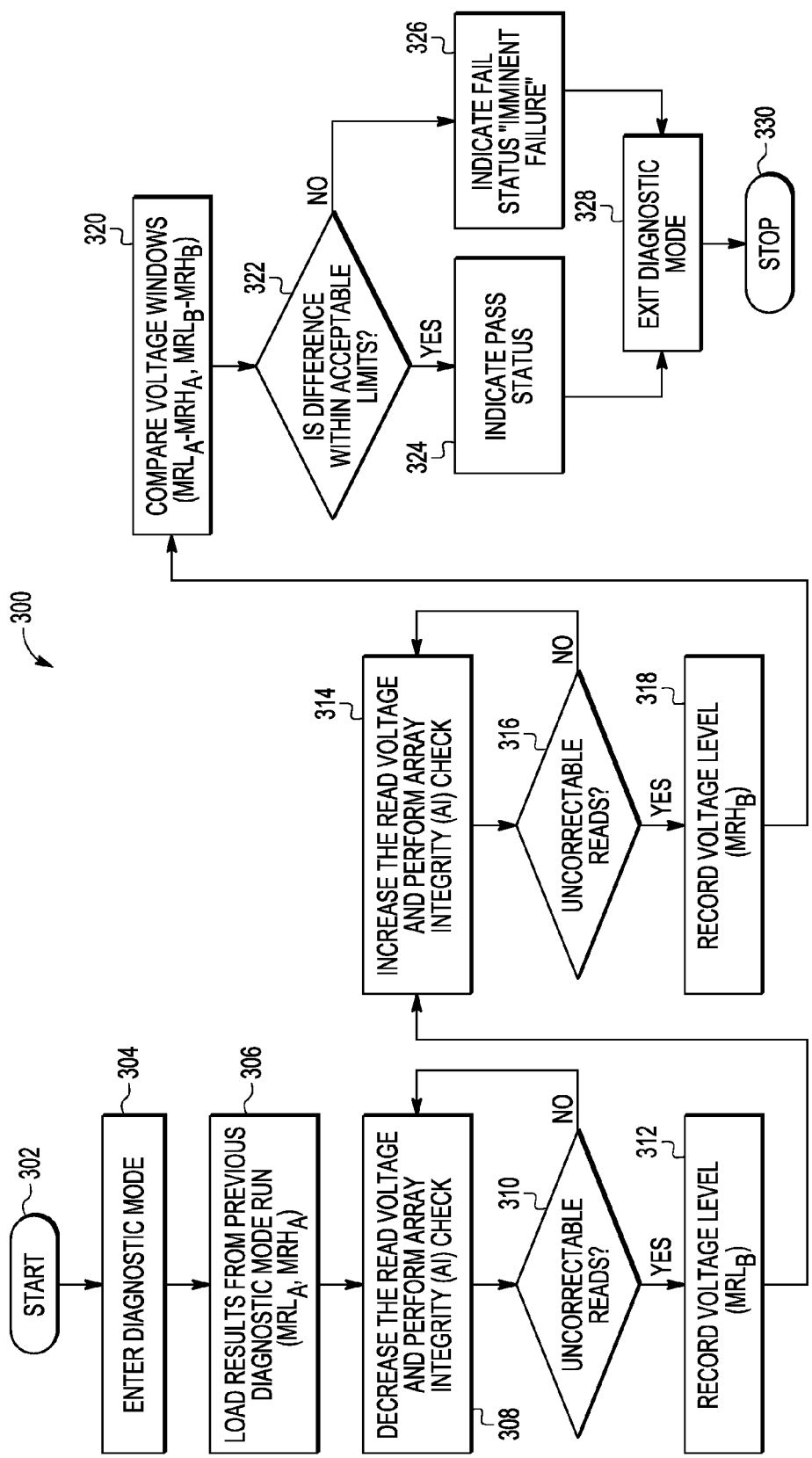
FIG. 3 is a process flow diagram of an example embodiment where a diagnostic mode run at two different times uses high/low voltage sweeps and related error voltage windows for imminent failure detection for NVM cells.
Figure 4:
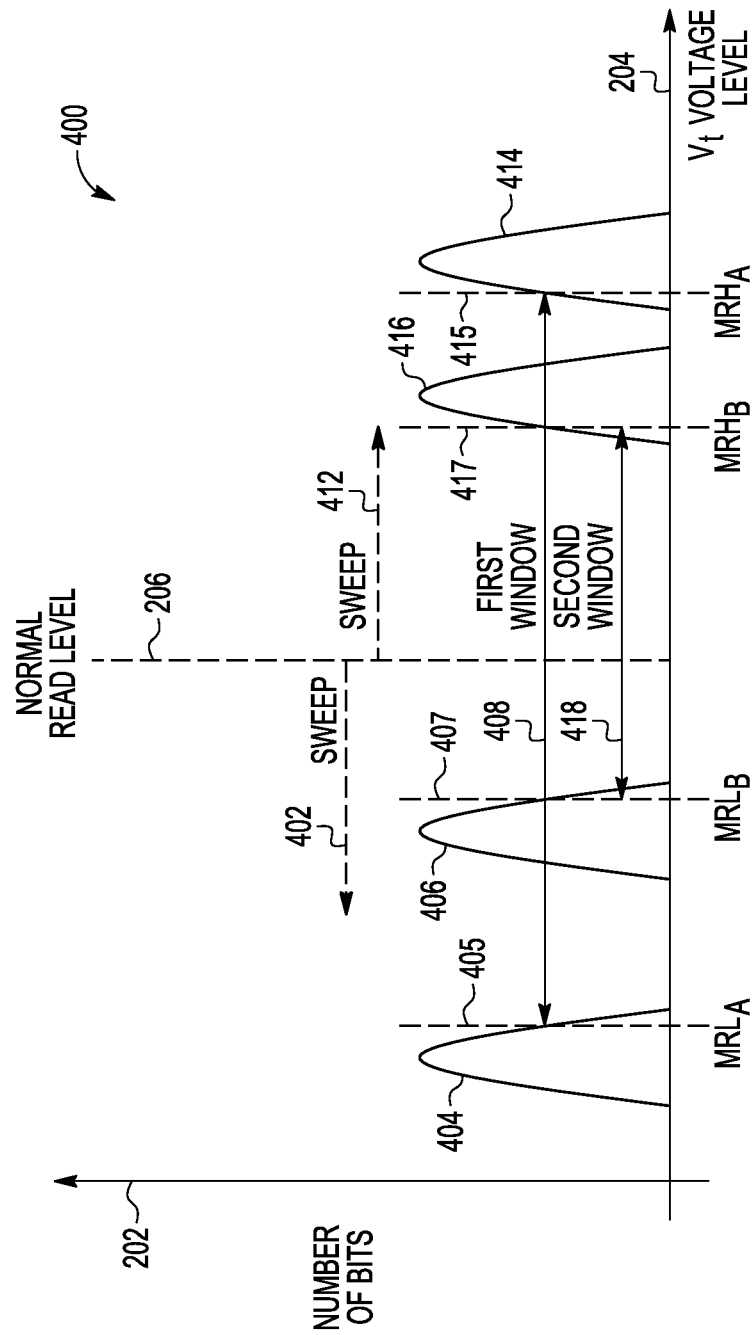
FIG. 4 is a bit distribution histogram associated with the embodiment of FIG. 3.

Advantageously, the embodiments described herein provide for detection of imminent read failures associated with unacceptable wear rates determined by running a diagnostic mode at two different times and recording low/high error voltage levels for each diagnostic test. The voltage difference between the voltage windows represented by these sets of low/high error voltage levels is used to determine whether or not the wear rate for the NVM cell array 124 is within acceptable parameters. FIG. 3 provides an example embodiment where this voltage difference is generated and compared to a voltage difference threshold value to identify unacceptable wear rates and to provide an associated failure indication. FIG. 4 provides example voltage distributions associated with the embodiment of FIG. 3.

FIG. 3 is a process flow diagram of an example embodiment 300 where a diagnostic mode and high/low read voltage level sweeps are used to detect unacceptable wear for NVM cells. In particular, embodiment 300 performs a diagnostic test of data within the NVM cell array 124 at different times. For a diagnostic test at a first time ($T_A$), a low read margin level sweep is conducted until an uncorrectable error is detected, and the low read margin voltage level ($MRL_A$) for this error is recorded. A high read margin level sweep is also conducted until an uncorrectable error is detected, and the high read margin voltage level ($MRH_A$) for this error is recorded. For a diagnostic test at a second time ($T_B$), a low read margin level sweep is conducted until an uncorrectable error is detected, and the low read margin voltage level ($MRL_B$) for this error is recorded. A high read margin level sweep is also conducted until an uncorrectable error is detected, and the high read margin voltage level ($MRH_B$) for this error is recorded. The difference between the voltage window for the first set of values ($MRH_A$–$MRL_A$) and the voltage window for the second set of values ($MRH_B$–$MRL_B$) are compared to an expected voltage difference threshold value ($V_{TH}$) to determine whether to report an imminent failure condition. It is again noted that a calibration table 116 stored within a data storage medium, such as data storage medium 112, can be used to store the time (T) values associated with expected voltage window (VW) values that can be used to determine the voltage difference threshold value ($V_{TH}$) for this comparison.

Looking now in more detail to FIG. 3, the imminent failure detection process starts in block 302, and it is assumed that a previous diagnostic mode has run steps 302, 304, and 308 to 318 at a first time ($T_A$) to determine a first read margin low voltage level ($MRL_A$) and a first read margin high voltage value ($MRH_A$) associated with uncorrectable errors detected from high and low voltage sweeps, such as is described below for the second high/low error voltage levels. At the end of this first diagnostic mode, the first read margin low voltage level ($MRL_A$) and the first read margin high voltage value ($MRH_A$) can be stored in the data storage medium 112.

In blocks 302 and 304, a diagnostic mode is again started and entered at a second time ($T_B$). In block 306, the results ($MRL_A$, $MRH_A$) from the previous diagnostic mode run are loaded, for example, from data storage medium 112. In block 308, the read voltage level is incrementally decreased to a voltage level below the normal read voltage level. An array integrity (AI) check is then performed where the address sequencer 106 is used by the MMU 102 to cycle through addresses for the cell array 124 and to conduct a read and ECC operation for each address. In block 310, a determination is made whether the ECC logic 104 detected an uncorrectable read error (e.g., double-bit error). If "NO," then flow passes back to block 308 where the read voltage level is again incrementally decreased to another voltage level further below the normal read voltage level. Steps 308 and 310 are repeated until an uncorrectable read error is detected and the determination in block 310 is "YES." It is noted that the incremental decreases to the read voltage level can be, for example, in increments of 0.1 volts and other incremental values can also be utilized, as desired. Once the determination in block 310 is "YES," block 312 is reached where the second low voltage level ($MRL_B$) for this detected error is recorded.

In block 314, the read voltage level is incrementally increased to a voltage level above the normal read voltage level. An array integrity (AI) check is then performed where the address sequencer 106 is used by the MMU 102 to cycle through addresses for the cell array 124 and to conduct a read and ECC operation for each address. In block 316, a determination is made whether the ECC logic 104 detected an uncorrectable error (e.g., double-bit error). If "NO," then flow passes back to block 314 where the read voltage level is again incrementally increased to a different voltage level further above the normal read voltage level. Steps 314 and 316 are repeated until an uncorrectable error is detected and the determination in block 316 is "YES." It is noted that the incremental increases to the read voltage level can be, for example, in increments of 0.1 volts and other incremental values can also be utilized, as desired. Once the determination in block 316 is "YES," block 318 is reached where the second high voltage level ($MRH_B$) for this detected error is recorded.

Block 320 is then reached where the error voltage window between the first set of values ($MRH_A$–$MRL_A$) and the error voltage window between the second set of values ($MRH_B$–$MRL_B$) are compared to determine a difference between these error voltage windows. In block 322, a determination is made whether the difference between these error voltage windows is within acceptable limits, for example, by comparing the difference to a voltage difference threshold value. As described herein, the voltage difference threshold value ($V_{TH}$) can be determined by the difference between the expected voltage window values ($VW_A$, $VW_B$) obtained from the calibration table 115 that were associated with the time values ($T_A$, $T_B$) for when the first and second diagnostic routines were run. In one embodiment, if the difference is less than or equal to a voltage difference threshold value ($V_{TH}$), then the difference is deemed acceptable (e.g., ($MRH_A$–$MRL_A$)–($MRH_B$–$MRL_B$)<$V_{TH}$) and a pass condition is indicated. However, if the difference is greater than the voltage difference threshold value ($V_{TH}$) the difference is deemed unacceptable (e.g., ($MRH_A$–$MRL_A$)–($MRH_B$–$MRL_B$)>$V_{TH}$) and an imminent failure condition is indicated. If the determination in block 322 is "NO" and the difference is acceptable, then flow passes to block 324 where a pass status is indicated, for example, using the failure indicator signal 138 and/or flag 114. If the determination in block 322 is "YES" and the difference is not acceptable, then flow passes to block 326 where an imminent fail status is indicated, for example, using the failure indicator signal 138 and/or flag 114. The diagnostic mode is exited in block 328 which is reached from block 324 or block 326, and the process stops in block 330.

It is noted that a failure flag 114 can also be stored within data storage medium 112 to represent the fail or pass status for the imminent failure detection. The failure data 140 including the flag 114, time/voltage window (T/VW) calibration table 115, the first set of low/high error voltage levels ($MRL_A$, $MRH_A$) 118, the second set of low/high error voltage levels ($MRL_B$, $MRH_B$) 119, and/or other data can be stored within the data storage medium 112. Further, this failure data can be accessed by or provided to external circuitry or devices. It is again noted that the voltage difference threshold value ($V_{TH}$) can be determined by the difference between the expected voltage window values obtained from the calibration table (e.g., $V_{TH}=VW_A-VW_B$). It is also noted that additional and/or different process blocks could also be used with respect to embodiment 300 if desired. Further, embodiment 300 can be repeated one or more additional times, as desired. For each new run of the diagnostic routine, the run time and newly generated low/high error voltage levels are used as the second time ($T_B$) and the second set of error voltage levels ($MRL_B$, $MRH_B$), and a previous run time and a low/high error voltage levels generated by that previous run are used as the first time ($T_A$) and the first set of error voltage levels ($MRL_A$, $MRH_A$). As such, wear rate determinations for imminent failure detection can be made repeatedly over time.

As indicated above, a calibration table 115 can be used by the NVM system 100 to store expected voltage window (VW) values used by the imminent failure determination. The data for this table can be determined and stored, for example, based upon data measured during production test for the NVM system 100. The TABLE below provides an example for a calibration table that can be stored within the NVM system 100, such as within data storage medium 112 and/or another data storage medium coupled to NVM system 100. For this example embodiment, the TABLE stores a range of potential calibration time (T) values and the expected voltage window (VW) values associated with these calibration time values.

TABLE

EXAMPLE CALIBRATION TABLE

| TIME (T) VALUES | EXPECTED VOLTAGE WINDOW (VW) VALUES |
|---|---|
| T1 | VW1 |
| T2 | VW2 |
| T3 | VW3 |
| T4 | VW4 |
| ... | ... |
| T100 | VW100 |
| ... | ... |
| T(N − 1) | VW(N − 1) |
| T(N) | VW(N) |

For the example TABLE above, a selected number (N) of time values are stored in the calibration table. These N time values can be evenly distributed across the expected product lifetime for the NVM system 100 or can be distributed using another technique, if desired. The same number (N) of voltage window values are also stored and associated with these time values. When the diagnostic routine is run at the first time ($T_A$), the calibration table is used to lookup the voltage window associated with a calibration time that matches this first time ($T_A$). Similarly, when the diagnostic routine is run at the second time ($T_B$), the calibration table is used to lookup the voltage window associated with a calibration time that matches this second time ($T_B$). For example, assuming that the first time ($T_A$) for the first diagnostic run correlates to T3 and the second time ($T_B$) for the second diagnostic run correlates to T100, then VW3 is used as the first expected voltage window ($VW_A$) and VW100 is used as the second expected voltage window ($VW_B$). As described herein, the difference threshold value ($V_{TH}$) can then be determined using the difference between these two calibration voltage windows such that $V_{TH}=VW_A-VW_B=V3-V100$. It is noted that the expected voltage windows are assumed to become smaller over time as the NVM cells within the NVM system age.

It is also noted that the time values described herein are representations of the passage of time and are not required to be direct time measurements. Although timestamps from a reference clock can be used to trigger diagnostic runs and an actual time representation (e.g., years, months, days, minutes, etc.) can be used for the time values within the calibration table, other non-direct representations of time can also be used such as one or more counted values. For example, one or more counts or incremented values can be used instead of a direct timestamp or time measurement. In one embodiment, a number of power-up events for the NVM system 100 can be tracked and used to represent passage of time such that the time values represent power-up events. A number of operational cycles for the NVM system 100 can also be used to represent passage of time such the time values represent a number of operational cycles after which the diagnostic mode will be run. With respect to an automotive solution, for example, a number of automobile starts for an automobile within which the NVM system 100 is installed and operating can be used to represent passage of time such the time values represent automobile starts. An odometer reading for an automobile can also be used to represent passage of time such the time values represent mileage. Other representations of the passage of time could also be used while still taking advantage of the imminent failure detection embodiments described herein.

FIG. 4 is a bit distribution histogram 400 associated with the embodiment of FIG. 3. For embodiment 400, the y-axis 202 represents a number of bits within the cell array having threshold voltage (Vt) levels in an erased state (e.g., representing logic 1s) and in a programmed state (e.g., representing logic 0s). The x-axis 204 represents threshold voltage (Vt) levels for the NVM cells. The distribution curves 404 and 406 represent erased state bits, and the distribution curves 414 and 416 represent programmed state bits. Voltage level 206 represents a normal read level such that bits having voltage levels above this read level are deemed to be programmed bits (e.g., logic 0s) and bits having voltage levels below this read level are deemed to be erased bits (e.g., logic 1s). Arrow 402 represents a low voltage sweep that is conducted during diagnostic modes to incrementally decrease the read voltage level to lower values, and arrow 412 represents a high voltage sweep that is conducted during diagnostic modes to incrementally increase the read voltage level to higher values. It is again noted that the logic 0 or logic 1 designation give to an erased or programmed bit could be switched, if desired, such that an erased bit is a logic 0 and a programmed bit is a logic 1. Other variations could also be implemented.

It is also noted that for one example implementation voltages can be incrementally decreased from the normal read voltage level using voltage steps of between 0.05 to 0.10 volt steps for the low voltage sweep 402 and can be incrementally increased from the normal read voltage level by 0.05 to 0.10 volt steps for high voltage sweep 412. Further, for an additional example implementation, 4.5 volts can be used for the normal read voltage level, and 0.1 volts can be used for the voltage increments. Other voltages levels and voltage increments could be use as desired, and the voltage levels and voltage increments could also be adjusted over time.

As described above, the address sequencer 106 is used by the MMU 102 to cycle through the addresses for the cell array for each voltage level during the low voltage sweep 402 and for each voltage level during the high voltage sweep 412. For embodiment 400, distribution 404 represents the location for the erased bit distribution when an uncorrectable error is detected during the low voltage sweep 402 ran at a first time ($T_A$). As indicated above, the read low voltage level ($MRL_A$) is recorded when the uncorrectable error is detected for this first time ($T_A$). Distribution 414 represents the location for the programmed bit distribution when an uncorrectable error is detected during the high voltage sweep 412 ran at a first time ($T_A$). As indicated above, the read high voltage level ($MRH_A$) is recorded when the uncorrectable error is detected for this first time ($T_A$). Similarly, distribution 406 represents the location for the erased bit distribution when an uncorrectable error is detected during the low voltage sweep 402 ran at a second time ($T_B$). As indicated above, the read low voltage level ($MRL_B$) is recorded when the uncorrectable error is detected for this second time ($T_B$). Distribution 416 represents the location for the programmed bit distribution when an uncorrectable error is detected during the high voltage sweep 412 ran at a second time ($T_B$). As indicated above, the read high voltage level ($MRH_B$) is recorded when the uncorrectable error is detected for this second time ($T_B$).

The first set of voltage values ($MRH_A$, $MRL_A$) recorded for the low/high voltage sweeps when the diagnostic mode is run at a first time ($T_A$) are used to define a first voltage window 408 representing the difference between these values ($MRH_A$−$MRL_A$). The second set of voltage values ($MRH_B$, $MRL_B$) recorded for the low/high voltage sweeps when the diagnostic mode is run at a second time ($T_B$) are used to define a second voltage window 418 representing the difference between these values ($MRH_B$−$MRL_B$). The difference between these voltage windows represents the wear rate for the NVM cell array 124. If the wear rate is relatively fast, this difference will be relatively larger. If the wear rate is relatively slow, this difference will be relatively smaller. As such, a comparison to a voltage difference threshold value ($V_{TH}$) associated with an acceptable wear rate can be used to make a determination of whether or not to indicate an imminent failure condition. For example, if the difference between the voltage windows 408 and 418 is less than or equal to a voltage difference threshold value (e.g., ($MRH_A$−$MRL_A$)−($MRH_B$−$MRL_B$)≤$V_{TH}$) then the difference is deemed acceptable and a pass condition is indicated. However, if the difference between the voltage windows 408 and 418 is greater than the voltage difference threshold value (e.g., ($MRH_A$−$MRL_A$)−($MRH_B$−$MRL_B$)>$V_{TH}$), the difference is deemed unacceptable and an imminent failure condition is indicated. As described above, the voltage difference threshold value ($V_{TH}$) can be determined by the difference between expected voltage window (VW) values obtained from a calibration table that associates expected voltage window (VW) values with time (T) values representing the operational lifetime of the NVM system 100.

As described herein, a variety of embodiments can be implemented and different features and variations can be implemented, as desired.

In one embodiment, a method for detecting imminent read failures for a non-volatile memory (NVM) system is disclosed that includes defining first and second voltage windows. At a first time, the method includes performing a low read voltage sweep for an array of non-volatile memory (NVM) cells to determine a first low error voltage level, performing a high read voltage sweep for the array of NVM cells to determine a first high error voltage level, and defining a first voltage window based upon a difference between the first high error voltage level and the first low error voltage level. At a second time, the method includes performing a low read voltage sweep for the array of NVM cells to determine a second low error voltage level, performing a high read voltage sweep for the array of NVM cells to determine a second high error voltage level, and defining a second voltage window based upon a difference between the second high error voltage level and the second low error voltage level. The method further includes comparing a difference between the first voltage window and the second voltage window to a voltage difference threshold value and indicating an imminent read failure for the array of NVM cells based upon the comparison.

For other embodiments, the method can further include incrementally decreasing a read voltage level from a normal read voltage level to perform the low voltage sweeps and incrementally increasing the read voltage level from the normal read voltage level for the high voltage sweeps where the normal read voltage level being used for non-diagnostic read operations for the array of NVM cells. For further embodiments, the incrementally decreasing can include incrementally decreasing the voltage level from the normal read voltage level by between 0.05 to 0.10 volt steps, and the incrementally increasing can include incrementally increasing the voltage level from the normal read voltage level by between 0.05 to 0.10 volt steps. For another embodiment, the normal read voltage level can be 4.5 volts; the incrementally decreasing can use a 0.10 volt step; and the incrementally increasing can use a 0.10 volt step. For still further embodiments, each performing step can include performing read and error correction operations for the array of NVM cells at each read voltage level used for the read voltage sweep until the uncorrectable bit error is detected and recording a read voltage level associated with the uncorrectable bit error as the error voltage level.

For further embodiments, the method can include accessing a calibration table to determine expected voltage window values associated with the first and second times and using a difference between the expected voltage window values to determine the voltage difference threshold value. In addition, the method can include using one or more error correction code (ECC) routines for the periodically performing steps. Further, the error correction routines can be configured to identify a double-bit error as an uncorrectable read error.

For still further embodiments, the indicating step can include storing within a data storage medium a flag indicating whether or not an imminent read failure condition has been detected. For other embodiments, the indicating step can include outputting a failure indicator signal.

For other embodiments, the first time and the second time can be timestamps. For further embodiments, the first failure time and the second time can be counted values. In addition, the counted value can be at least one the following: power-up events for the NVM system, operational cycles for the NVM system, automobile starts for an automobile within which the NVM system is operating, or odometer readings for an automobile within which the NVM system is operating.

In another embodiment, a non-volatile memory (NVM) system having imminent read failure detection is disclosed that includes a non-volatile memory (NVM) including an array of NVM cells, a memory management unit coupled to the array of NVM cells, and a controller within the memory management unit coupled to the NVM and configured to determine error voltage windows. From a diagnostic mode run at a first time, the controller is configured to determine a first voltage window associated with a difference between a first low error voltage level determined from a low read voltage sweep and a first high voltage error level determined from a high read voltage sweep. From the diagnostic mode run at a second time, the controller is configured to determine a second voltage window associated with a difference between a second low error voltage level determined from a low read voltage sweep and a second high voltage error level determined from a high read voltage sweep. The controller is further configured to compare a difference between the first and second voltage windows to a voltage difference threshold value and to indicate an imminent read failure for the array of NVM cells based upon the comparison.

For other embodiments, the NVM system further includes a data storage medium configured to store a calibration table including expected voltage window values associated with time values, and the controller is further configured to use the calibration table to obtain expected voltage window values associated with the first and second times and to use a difference between the expected voltage window values to determine the voltage difference threshold value. In addition, the memory management unit can further include error correction code (ECC) logic configured to run one or more ECC routines, and the controller can be further configured to use results from the ECC logic as indications of uncorrectable read errors.

For further embodiments, the controller can be further configured to store within the data storage medium a flag indicating whether or not an imminent read failure condition has been detected. Still further, the controller can be further configured to output a failure indicator signal.

For still further embodiments, the controller can be configured to incrementally decrease a read voltage level from a normal read voltage level for the low voltage sweeps and to incrementally increase the read voltage level from the normal read voltage level for the high voltage sweeps where the normal read voltage level being used for non-diagnostic read operations for the array of NVM cells. In addition, the controller can be configured to use 0.05 to 0.10 volt steps for low and high voltage sweeps.

It is noted that the functional blocks, devices, and/or circuitry described herein, including those described with respect to the memory management unit 102 and the non-volatile memory 120, can be implemented using hardware, software, or a combination of hardware and software. In addition, one or more processing devices executing software and/or firmware instructions can be used to implement the disclosed embodiments. It is further understood that one or more of the operations, tasks, functions, or methodologies described herein can be implemented, for example, as software, firmware and/or other program instructions that are embodied in one or more non-transitory tangible computer readable mediums (e.g., data storage devices, FLASH memory, random access memory, read only memory, programmable memory devices, reprogrammable storage devices, hard drives, floppy disks, DVDs, CD-ROMs, and/or any other tangible storage medium) and that are executed by one or more central processing units (CPUs), controllers, microcontrollers, microprocessors, hardware accelerators, processors, and/or other processing devices to perform the operations and functions described herein.

Unless stated otherwise, terms such as "first" and "second" are used to arbitrarily distinguish between the elements such terms describe. Thus, these terms are not necessarily intended to indicate temporal or other prioritization of such elements.

Further modifications and alternative embodiments of the described systems and methods will be apparent to those skilled in the art in view of this description. It will be recognized, therefore, that the described systems and methods are not limited by these example arrangements. It is to be understood that the forms of the systems and methods herein shown and described are to be taken as example embodiments. Various changes may be made in the implementations. Thus, although the invention is described herein with reference to specific embodiments, various modifications and changes can be made without departing from the scope of the present invention. Accordingly, the specification and figures are to be regarded in an illustrative rather than a restrictive sense, and such modifications are intended to be included within the scope of the present invention. Further, any benefits, advantages, or solutions to problems that are described herein with regard to specific embodiments are not intended to be construed as a critical, required, or essential feature or element of any or all the claims.

What is claimed is:

1. A method for detecting imminent read failures for a non-volatile memory (NVM) system, comprising:
at a first time:
performing a low read voltage sweep for an array of non-volatile memory (NVM) cells to determine a first low error voltage level;
performing a high read voltage sweep for the array of NVM cells to determine a first high error voltage level;
defining a first voltage window based upon a difference between the first high error voltage level and the first low error voltage level;
at a second time:
performing a low read voltage sweep for the array of NVM cells to determine a second low error voltage level;
performing a high read voltage sweep for the array of NVM cells to determine a second high error voltage level; and
defining a second voltage window based upon a difference between the second high error voltage level and the second low error voltage level;
comparing a difference between the first voltage window and the second voltage window to a voltage difference threshold value; and
indicating an imminent read failure for the array of NVM cells based upon the comparison.

2. The method of claim 1, further comprising incrementally decreasing a read voltage level from a normal read voltage level to perform the low voltage sweeps and incrementally increasing the read voltage level from the normal read voltage level for the high voltage sweeps, the normal read voltage level being used for non-diagnostic read operations for the array of NVM cells.

3. The method of claim 2, wherein the incrementally decreasing comprises incrementally decreasing the voltage level from the normal read voltage level by between 0.05 to 0.10 volt steps, and the incrementally increasing comprises incrementally increasing the voltage level from the normal read voltage level by between 0.05 to 0.10 volt steps.

4. The method of claim 3, wherein the normal read voltage level is 4.5 volts, wherein the incrementally decreasing uses a 0.10 volt step, and wherein the incrementally increasing uses a 0.10 volt step.

5. The method of claim 2, wherein each performing step comprises performing read and error correction operations for the array of NVM cells at each read voltage level used for the read voltage sweep until the uncorrectable bit error is detected and recording a read voltage level associated with the uncorrectable bit error as the error voltage level.

6. The method of claim 1, further comprising accessing a calibration table to determine expected voltage window values associated with the first and second times and using a difference between the expected voltage window values to determine the voltage difference threshold value.

7. The method of claim 1, further comprising using one or more error correction code (ECC) routines for the periodically performing steps.

8. The method of claim 7, wherein the error correction routines are configured to identify a double-bit error as an uncorrectable read error.

9. The method of claim 1, wherein the indicating step comprises storing within a data storage medium a flag indicating whether or not an imminent read failure condition has been detected.

10. The method of claim 1, wherein the indicating step comprises outputting a failure indicator signal.

11. The method of claim 1, wherein the first time and the second time comprise timestamps.

12. The method of claim 1, wherein the first failure time and the second time comprise counted values.

13. The method of claim 12, wherein the counted value comprises at least one the following: power-up events for the NVM system, operational cycles for the NVM system, automobile starts for an automobile within which the NVM system is operating, or odometer readings for an automobile within which the NVM system is operating.

14. A non-volatile memory (NVM) system having imminent read failure detection, comprising:
a non-volatile memory (NVM) including an array of NVM cells;
a memory management unit coupled to the array of NVM cells;
a controller within the memory management unit coupled to the NVM and configured to
determine from a diagnostic mode run at a first time a first voltage window associated with a difference between a first low error voltage level determined from a low read voltage sweep and a first high voltage error level determined from a high read voltage sweep, to determine from the diagnostic mode run at a second time a second voltage window associated with a difference between a second low error voltage level determined from a low read voltage sweep and a second high voltage error level determined from a high read voltage sweep, to compare a difference between the first and second voltage windows to a voltage difference threshold value, and to indicate an imminent read failure for the array of NVM cells based upon the comparison.

15. The NVM system of claim 14, further comprising a data storage medium configured to store a calibration table including expected voltage window values associated with time values, and wherein the controller is further configured to use the calibration table to obtain expected voltage window values associated with the first and second times and to use a difference between the expected voltage window values to determine the voltage difference threshold value.

16. The NVM system of claim 14, wherein the memory management unit further comprises error correction code (ECC) logic configured to run one or more ECC routines, and wherein the controller is further configured to use results from the ECC logic as indications of uncorrectable read errors.

17. The NVM system of claim 14, wherein the controller is further configured to store within the data storage medium a flag indicating whether or not an imminent read failure condition has been detected.

18. The NVM system of claim 14, wherein the controller is further configured to output a failure indicator signal.

19. The NVM system of claim 14, wherein the controller is configured to incrementally decrease a read voltage level from a normal read voltage level for the low voltage sweeps and to incrementally increase the read voltage level from the normal read voltage level for the high voltage sweeps, the normal read voltage level being used for non-diagnostic read operations for the array of NVM cells.

20. The NVM system of claim 19, wherein the controller is configured to use 0.05 to 0.10 volt steps for low and high voltage sweeps.

* * * * *